United States Patent [19]
Crivello

[11] Patent Number: 5,639,413
[45] Date of Patent: Jun. 17, 1997

[54] METHODS AND COMPOSITIONS RELATED TO STEREOLITHOGRAPHY

[76] Inventor: James Vincent Crivello, 756 Carlton Rd., Clifton Park, N.Y. 12065

[21] Appl. No.: 413,258

[22] Filed: Mar. 30, 1995

[51] Int. Cl.$^6$ ............................................. B29C 35/08
[52] U.S. Cl. ..................... 264/401; 425/174.4; 430/280.1
[58] Field of Search .......................... 425/174.4; 264/401; 430/280.1

[56] References Cited

U.S. PATENT DOCUMENTS

| | | | |
|---|---|---|---|
| 4,081,276 | 3/1978 | Crivello | 430/269 |
| 4,120,866 | 10/1978 | Winkler | 548/440 |
| 4,575,330 | 3/1986 | Hull | 425/174.4 |
| 4,929,402 | 5/1990 | Hull | 264/401 |
| 5,037,861 | 8/1991 | Crivello et al. | 522/172 |
| 5,175,077 | 12/1992 | Grossa | 264/401 |
| 5,437,964 | 8/1995 | Lapin et al. | 430/280.1 |
| 5,468,886 | 11/1995 | Steinmann et al. | 549/549 |
| 5,470,689 | 11/1995 | Wolf et al. | 425/174.4 X |
| 5,476,748 | 12/1995 | Steinmann et al. | 430/269 |
| 5,494,618 | 2/1996 | Steinmann et al. | 264/401 |
| 5,495,029 | 2/1996 | Steinmann et al. | 549/545 |
| 5,510,226 | 4/1996 | Lapin et al. | 430/280.1 X |

OTHER PUBLICATIONS

"Rapid Prototyping and Manufacturing", Hunziker et al., *Society of Plastic Engineers*, Chapter 2 (16 pgs.) (1992).
"Stereolithography: An Introduction", D.C. Neckers, *Chemtech*, 615–619 (1990).
"Epoxyorganosiloxanes", Plueddemann et al., *J. Am. Chem. Soc.* 81, 2632–2635 (1959).
"The Synthesis, Characterization, and Photoinitiated Cationic . . . ", Crivello et al., *J. Polym. Sci., Polym. Chem. Ed.* 28, 479–503 (1990).
"Cationic Polymerization–Iodonium and Sulfonium Salt Photoinitiators", Crivello, *Adv. in Polym. Sci.* 62, 1–48 (1984).
"Synthesis of Aryl–Substituted Sulfonium Salts by the . . . ", Akhtar et al., *J. Org. Chem.* 55, 4222–4225 (1990).

*Primary Examiner*—Richard L. Chiesa
*Attorney, Agent, or Firm*—Heslin & Rothenberg, P.C.

[57] ABSTRACT

An improved system for producing a three-dimensional object from a fluid medium is described. The fluid medium includes an epoxy-functional silicon-containing monomer or oligomer, and a suitable cationic photoinitiator. The medium is used in a stereolithographic apparatus, which converts computer-generated data for the desired part to a real three-dimensional part, via the directed action of a laser beam or similar energy form on the liquid medium. This invention also embraces a method for producing the three-dimensional object from the liquid medium, utilizing a family of epoxy-functional silicon-containing materials.

34 Claims, 1 Drawing Sheet

Figure 1

METHODS AND COMPOSITIONS RELATED TO STEREOLITHOGRAPHY

TECHNICAL FIELD

This invention generally relates to stereolithography. More specifically, it relates to improved compositions and processes for the preparation of precise three-dimensional objects from a fluid medium.

BACKGROUND OF THE INVENTION

Stereolithography is a relatively new technology which permits the direct translation of a graphically-generated object into a solid, 3-dimensional object. Many aspects of stereolithography are described by C. Hull in U.S. Pat. Nos. 4,575,330 and 4,929,402. This technology is very useful in prototyping applications, because the prototypes can be rapidly and accurately formed from computer-generated graphic models.

Briefly summarized, one popular version of stereolithography involves the generation of a 3-dimensional object on a computer, using computer-aided design and engineering software. The computer is then, in effect, instructed to mathematically divide the graphical object into thin sections or "slices". Each section can then be treated as a two-dimensional object having x, y coordinates. The computer is then instructed to direct the position of a laser beam according to the dimensions of those coordinates. The laser is directed onto the surface of a container of a liquid—usually some sort of photopolymerizable material. Polymerization occurs only in those areas which are contacted by the laser beam, thereby forming a solid polymer. As each two-dimensional section is formed, a movable platform lowers the layer to a position just below the surface of the polymerizable liquid. Then, the next "slice" is drawn on top of the previous slice by the action of a laser. The process is repeated, stacking polymerized layer upon layer, until the entire solid object is formed.

Clearly, stereolithography is a very attractive technology in the design field. Complex models can be rapidly and automatically produced by such a technique, in contrast to older processes which required great amounts of time and effort on the part of trained craftsmen in achieving the precise dimensions required. The prototypes prepared by stereolithography are used in the design of articles made from a wide variety of materials, e.g., metal, glass, plastic, and wood. The end products are countless: automobiles, airplanes, turbine engines, windmills, boats, electrical connectors, machine tools, electronic devices, etc.

It's clear that stereolithography depends to a large extent on the chemical process used to polymerize the liquid monomer. Thus, the capabilities of stereolithography are limited to some degree by the related polymerization chemistry—most often, photopolymerization. As an example, the final, solid object must be dimensionally faithful to the computer-generated design. Current stereolithographic applications require the formation of mechanically stable photopolymers that are true to within 0.005 inch of design. Such an exact tolerance requires precise contact of the laser beam with the specified dimension of the monomer mixture.

Typical materials currently used in photopolymerization for stereolithography include acrylate or vinyl ether-based photopolymers. However, these materials sometimes shrink during photopolymerization. For example, acrylate photopolymers may shrink about 6–8% in volume, resulting in considerable distortion in the shape of the final object.

Furthermore, the presently-used photopolymers often do not have a glass transition temperature ($T_g$) high enough to prevent warpage on standing, or on exposure to moderate temperatures present during subsequent processing steps, e.g., drilling, machining, or sanding.

Moreover, some of the acrylate photopolymer resins tend to be toxic and skin-sensitizing. Workers who become sensitized to the photopolymers must avoid all future contact with the resins. Special precautions must be taken in the placement of stereolithographic equipment to avoid undue worker exposure, and to comply with safety and health regulations.

In view of some of the drawbacks associated with currently-used photopolymers for stereolithography, a search has been in progress to replace such materials with alternative systems. However, the search has been largely unsuccessful and unsatisfactory for various reasons. For example, some of the proposed replacement systems exhibit poor photosensitivity to laser-produced UV light. The photosensitivity (or "photoresponse") of a photopolymer determines the speed with which the image can be "written onto" the surface of the polymerizable liquid. Thus, poor photosensitivity will greatly decrease the speed at which the solid, 3-dimensional object can be generated, consequently decreasing the efficiency of the overall process.

It's thus apparent that the art of stereolithography still requires photopolymerizable materials which exhibit good photosensitivity, and which minimize any distortion of the polymerized object, leading to a very precise reproduction of the imaged object. Furthermore, these materials should be relatively innocuous from a health and safety standpoint.

SUMMARY OF THE INVENTION

The needs discussed above have been satisfied by the discovery of an improved stereolithographic process which utilizes a photopolymer mixture based on the silicon-containing multifunctional epoxy materials described below. The fluid medium which becomes polymerized includes a cationic photoinitiator for the silicon-containing epoxy material. The medium can also include other components, such as acrylate or methacrylate monomers, vinyl or ether monomers, additional epoxy resins, polyol resins, a photosensitizer, and various other additives.

Stereolithographic systems incorporating such materials also form part of the present invention.

As demonstrated in the examples which follow, use of the present invention results in rapid polymerization of a 3-dimensional object which conforms very closely to a graphically-generated image. Furthermore, the cured photopolymers are tough, transparent, colorless solids with high glass transition temperatures.

DETAILED DESCRIPTION OF THE INVENTION

Component (a) is a body of fluid medium capable of solidification when subjected to prescribed stimulation. The medium itself comprises (i) at least one monomer or oligomer containing at least one epoxycyclohexyl group which is bonded directly or indirectly to a group containing at least one silicon atom, and (ii) a cationic photoinitiator for component (i).

A considerable variety of materials are suitable for use as component (i). As an example, epoxy-functional silicone monomers or oligomers may be used. These materials may be linear, branched, or cyclic in structure. Linear materials of this type usually comprise multifunctional siloxane units having a formula selected from the group consisting of (I)

(II)

and, (III)

wherein each R group is, independently, a monovalent substituted or unsubstituted $C_{1-12}$ alkyl, $C_{1-12}$ cycloalkyl, or phenyl radical; each $R^1$ group is, independently, R, a monovalent $C_{2-12}$ alkyl radical, or a monovalent epoxy-functional group having about 2 to 10 carbon atoms. $R^2$ is an alkylene or alkylene ether group containing about 2 to about 20 carbon atoms; n is about 1 to about 10; and m is 1 to 4. In formulae I–III, at least one of the $R^1$ groups must be epoxy-functional.

Some of the preferred silicone monomers and oligomers falling within the scope of structures I–III are as follows:

The preferred linear epoxy-functional silicone monomers for some embodiments of this invention are bis[2-(3{7-oxabicyclo[4.1.0]heptyl})ethyl]-1,1,3,3-tetramethyldisiloxane (formula IV), and bis[2(2,3-epoxybicyclo[2.2.1]heptyl)ethyl]-1,1,3,3-tetramethyldisiloxane.

The preparation of epoxy-functional silicone monomers and oligomers is well known in the art. As an example, E. Plueddemann et al. generally describe epoxy organosiloxanes and their preparation in *J. Am. Chem. Soc.*, Vol.81, 2632–2635 (1959). As another example, J. V. Crivello et al. describe the preparation of a variety of silicon-containing epoxy monomers and oligomers, in *Journal of Polymer Science; Part A: Polymer Chemistry Edition*, Vol. 28, 479–503 (1990). The Plueddemann and Crivello articles are incorporated herein by reference.

The following equation illustrates the preparation of one such monomer, i.e., that which is set forth as formula IV:

Those of skill in the art understand that synthesis of these types of materials usually involves the hydrosilation of 4-vinylcyclohexene oxide, using various di-, tri-, and polyfunctional silanes. A variety of catalysts have been found to be suitable for this reaction, e.g., complexes of platinum, rhodium, iridium, cobalt, and nickel.

Another example of an epoxy-functional silicone material suitable for this invention is an oligomeric polysiloxane

(IV)

(V)

(VI)

(VII)

and

(VIII)

containing pendant epoxycyclohexyl groups. These materials may be either homopolymers or copolymers. Many of them are represented by the formula (IX)

wherein R and $R^1$ are as defined above, n is from 0 to 200, and m is from 0 to 200. In this formula, at least one of the $R^1$ groups is epoxy-functional.

As an illustration, a material conforming to formula X may be prepared as follows:

where n and m have the values mentioned above. Those of ordinary skill in the art are very familiar with other details regarding the preparation of these materials.

Additional examples of epoxy-functional silicon materials are provided by the following formula:

(X)

wherein R and $R^1$ are as described above; at least one of the $R^1$ groups is epoxy-functional; and m is from 1 to 4.

Preparation of these types of materials is also known in the art, and described, for example, in the above referenced *Journal of Polymer Science; Part A: Polymer Chemistry Edition*, Vol. 28, 479–503 (1990). Specific examples of these types of materials are as follows:

(XI)

(XII)

and (XIII)

In view of factors such as ease of handling and preparation, compound XII is often preferred; it may be referred to as methylphenyl-di(epoxy cyclohexylethyl) silane.

Another type of epoxy-functional silicon-containing material which may be used for the fluid medium of this invention is a cyclic silicone monomer or oligomer. This material may comprise siloxane units of the formula (XIV)

wherein each R group is independently selected from the group consisting of monovalent $C_{1-12}$ alkyls, $C_{1-12}$ cycloalkyls, and phenyl radicals;

each $R^1$ group is independently selected from the group consisting of R, monovalent $C_{2-12}$ alkyl radicals, and a monovalent epoxy-functional group having about 2 to 10 carbon atoms, with the proviso that at least one of the $R^1$ groups is epoxy-functional. In this formula, n is from 3 to about 10, and preferably, 3 to about 5. In some particularly preferred embodiments, R is methyl, and $R^1$ is a methyl or cycloaliphatic epoxy-functional group having about 2 to 10 carbon atoms. In other preferred embodiments, R may be a monovalent halogen-substituted $C_{1-12}$ alkyl radical or a $C_{1-12}$ cycloalkyl radical. A specific example of this type of cyclic material is shown below:

(XV)

The preparation of cyclic epoxy-functional silicone monomers and oligomers is also known in the art and described, for example, in U.S. Pat. No. 5,037,861 to J. Crivello et al., incorporated herein by reference.

It should be understood that various other epoxy-functional silicon-based materials may be suitable for component (a); specific mention of all possible materials is not necessary here. However, they are considered within the scope of this invention if they are monomers or oligomers containing at least one epoxycyclohexyl group bonded directly or indirectly to a group containing at least one silicon atom.

The monomers and oligomers described above have considerable advantages for stereolithographic applications. First, they undergo exceptionally rapid photopolymerization in the presence of photoinitiators like the onium salts described below. Furthermore, the monomers do not, by themselves, have an absorption in the UV region of the light spectrum. Therefore, the depth of penetration of UV light into the liquid monomer can be large. Moreover, most of the epoxy-functional silicon materials described above are free-flowing, colorless liquids of low viscosity. This permits them to quickly flow and level off when the support means is lowered to begin the next imaging cycle, as described below.

Component (a)(ii) is a cationic photoinitiator for the epoxy-functional materials described above. These photoinitiators, as well as their function, are well-known in the art. Many are described by J. Crivello in "Cationic Polymerization-Iodonium and Sulfonium Salt Photoinitiators", *Adv. in Polym. Sci.*, 62, 1 (1984) pp. 1–48.

In order to be suitable for this invention, the photoinitiator must possess two important characteristics. First, it must be soluble in the silicon-containing epoxy-functional monomer or oligomer. Secondly, it must absorb the particular radiation used during the reaction step which alters the physical state of the fluid medium, e.g., the radiation emitted by a particular laser which may be used. In terms of some typical stereolithographic systems currently used in the field, the photoinitiator should absorb either at a wavelength of 325 nm for a helium-cadmium laser, or at 351 and 364 nm wavelengths for an argon-ion laser.

Examples of cationic photoinitiators for component (a)(ii) are onium salt photocatalysts selected from the group consisting of diaryliodonium salts, triarylsulfonium salts, aryldiazonium salts, ferrocenium salts, diarylsulfoxonium salts, diaryliodoxonium salts, triarylsulfoxonium salts, dialkylphenacylsulfonium salts, dialkylhydroxyphenylsulfonium salts, phenacyltriarylphosphonium salts, and phenacyl salts of heterocyclic nitrogen-containing compounds.

In terms of the suitability factors described above, triarylsulfonium salts are often preferred, e.g., SbF$_6^-$

(XVI)

SbF$_6^-$    SbF$_6^-$ (XVII)

and

SbF$_6^-$    SbF$_6^-$ (XVIII)

The SbF$_6^-$ anion is depicted in Formulae XVI–XVIII because those types of photoinitiators appear to permit the highest photosensitivity, which results in the fastest "writing" speed. However, it should be appreciated that various other photoinitiators may be used for this invention. For example, photoinitiators bearing various other anions—e.g., the PF$_6^-$, AsF$_6^-$, BF$_4^-$, CF$_3$SO$_3^-$ and (C$_6$F$_6$)$_4$B$^-$ anions—are also thought to be suitable for the stereolithographic system and process of this invention. Surprisingly, these particular photoinitiators also exhibit good solubility in the epoxy-functional silicon-based materials used herein. Photoinitiator "XVI" is especially preferred for some embodiments of this invention.

Another class of photoinitiators which may be used in this invention are triarylsulfonium salt photoinitiators represented by the formula (XIX)

wherein X$^-$ is SbF$_6^-$, PF$_6^-$, AsF$_6^-$, BF$_4^-$, ClO$_4^-$, and the like; and n may range from 1 to about 20.

Those of skill in the art of photocurable silicones will be able to select the most appropriate level of photoinitiator for this invention. In general, the level of photoinitiator will range from about 0.05% by weight to about 10% by weight, based on the total weight of component (a), and preferably, from about 0.25% by weight to about 5% by weight.

In addition to the epoxy-functional silicon-based materials, component (a) may also include acrylate or methacrylate materials which are polymerized by a free radical mechanism. Exemplary monomers of this type include hexanediol diacrylate, trimethylolpropane triacrylate, pentaerythritol triacrylate, neopentylglycol dimethacrylate, the diacrylic acid adduct to bisphenol A, and the diacrylic acid adduct to bisphenol A diglycidyl ether.

Free radical photoinitiators which may be used (in effective amounts) in conjunction with the acrylate or methacrylate materials are exemplified by the following: benzoin butyl ether; 2,2-diethoxyacetophenone; 2-chloroacetophenone; 1-benzoylcyclohexanol; and benzoyldiphenyl phosphine oxide.

When used, the total amount of the acrylate or methacrylate monomer and free radical photoinitiator present is in the range of about 0.1% by weight to about 35% by weight, based on the total weight of component (a). In preferred embodiments, the level of these materials will be in the range of about 10% by weight to about 25% by weight.

In some embodiments of this invention, the reactivity of the fluid medium can be enhanced by the additional inclusion of vinyl- and 1-propenyl ether monomers. These materials are cationically polymerizable, and may be mono-, di-, or multifunctional. Non-limiting examples of these monomers are diethylene glycol divinyl ether, diethylene glycol di-1-propenyl ether; 1,4-cyclohexanedimethanol divinyl ether; 1,4-cyclohexanedimethanol di-1-propenyl ether; [1,-hexanediol divinyl ether]; and [1,-hexanediol di-1-propenyl ether]. When used, the level of these cationically-polymerizable materials will be in the range of about 0.1% by weight to about 35% by weight, based on the total weight of component (a), and preferably, from about 10% by weight to about 25% by weight.

The fluid medium of component (a) may further include various epoxy resins. The addition of these materials can result in greater mechanical strength in the 3-dimensional object produced. Furthermore, these materials are often less costly than some of the photo-polymerizable ingredients, and their use as a constituent in the fluid medium may thereby reduce cost while retaining overall physical properties.

Illustrative epoxy resins are those selected from the group consisting of 3,4-epoxycyclohexylmethyl 3',4'-epoxycyclohexane carboxylate; bisphenol-A diglycidyl ether; epoxidized polybutadiene; 1,4-cyclohexanedimethanol diglycidyl ether; epoxidized linseed oil; epoxidized soybean oil; an epoxidized methyl ester of linoleic acid; limonene dioxide; dicyclopentadiene dioxide; epoxy cresol novolac resins; epoxy phenol novolac resins; 1,7-diepoxyoctane; vinyl cyclohexene monoxide; 1,4- butanediol diglycidyl ether; and diglycidylphthalate. When included, the epoxy resin is usually used at a level which ranges from about 1% by weight to about 50% by weight, based on the total weight of component (a), and preferably, from about 10% by weight to about 30% by weight.

Component (a) may also include at least one polyol resin. Those of particular interest herein are mono-, di-, tri-, and multifunctional low molecular weight oligomers, e.g., those having a molecular weight of about 200–5000 g/mol. In general, polyether polyols, polyester polyols, polycaprolactone polyols, hydroxyl-terminated polefins, and polyols based on sugars may be employed.

The polyols serve to modify the mechanical properties of the photocured object. When used, the level of polyol will usually range from about 10% by weight to about 35% by weight, based on the total weight of component (a). Lower levels of polyol within this range may provide the photocured object with greater hardness and rigidity, while higher levels may provide the final object with greater elastomeric character.

Sometimes, a copper co-catalyst is used in conjunction with the photocurable materials of this invention. These materials, as well as their function, are known in the art. Examples include copper stearate, copper napthenate, and copper acetate. The level of co-catalyst will usually range from about 0.1% by weight to about 5% by weight, based on the total weight of component (a).

When the reaction means used for the present invention includes a UV emission source having relatively long wavelengths, it is often desirable to use a photosensitizer in combination with the cationic photoinitiator described above. The function of the photoinitiator is to absorb the incident light. In doing so, it releases a catalytic agent which causes the polymerization of the monomers or oligomers. When light is employed which has a wavelength that it is not absorbed by the photoinitiator, no polymerization results, because the catalytic agent is not released. In these situations, a photosensitizer which does absorb the light of the wavelength specified may be used. Once activated by the absorption of light, the photosensitizer interacts with the photoinitiator to cause it to release the catalytic agent. Choice of a photosensitizer depends on various factors, such as the type of photoinitiator utilized, as well as the specific UV emission wavelength. They are usually polynuclear aromatic compounds and similar compounds bearing extended conjugation.

Examples of photosensitizers include anthracene, stilbene, isostilbene, naphthalene, perylene, pyrene, phenothiazine; 9,10-phenanthrenequinone; bianthrone; anthrone; 9-butoxyanthracene; 1-ethyl-9,10-dimethoxyanthracene; acridine orange; benzoflavin; phosphine R; 1-ethyl-9-ethoxyanthracene; 1-ethyl-9,10-dimethoxyanthracene; 2-isopropylthioxanthone; and 2-chlorothioxanthone.

In some cases, the photoinitiator and the photosensitizer may be bound together in the same molecule. For example, triarylsulfonium salts containing anthracene groups appear to exhibit long wavelength sensitivity. These materials are described in U.S. Pat. No. 4,120,866, incorporated herein by reference.

When used, the level of photosensitizer present will usually be in the range of about 0.05% by weight to about 10% by weight, based on the total weight of component (a). In preferred embodiments, this level will range from about 0.1% by weight to about 5% by weight.

Component (a) of the system according to this invention may include a wide variety of other additives. Non-limiting examples of these additives are adhesion agents, wetting agents, flatting agents, flow control agents, stabilizers, pigments, dyes, and fillers.

Each of these additives will be used in an amount effective to produce or adjust the characteristic to which it is directed. Those of ordinary skill in the art can select the proper level for a particular fluid medium without undue experimentation.

The viscosity of component (a) is an important parameter in determining its performance in stereolithographic applications. As described below for an exemplary apparatus, the platform supporting the object being formed is lowered to flood the imaged object in preparation for the addition of another layer. Component (a) must flow smoothly over the object and then level quickly to give a stable, uniform layer of liquid photopolymer for imaging. If the viscosity is too high, the flow and leveling will be slow. The time for leveling of each layer can be up to one-half of the total time for the construction of the object. Most currently-available stereolithographic photopolymers have viscosities in the range of 300 cps and above at 25° C. Consequently, the stereolithographic apparatus is commonly equipped with a wiper or drawknife which is drawn over the imaged object each time it is flooded with fresh liquid photopolymer to provide a uniform layer. If the viscosity of the resin is very high, the incompletely-cured, imaged layer can be damaged during this process.

The viscosity of the photopolymers of this invention is in the range of about 50 to about 2000 cps at 25° C., and is preferably in the range of about 60–300 cps.

The concept of photopolymerization is well-known in the art. Its use with epoxy-functional silicone materials is clearly described, for example, in the above-referenced U.S. Pat. No. 5,037,861. Another source for information on the subject is provided by P. F. Jacobs (editor) in "Rapid Prototyping and Manufacturing", *Society of Plastics Engineers*, Chapter 2 (1992). This text is also incorporated herein by reference. These references, along with the specific teachings herein, will enable those skilled in the art to readily practice all aspects of the present invention.

One exemplary system or "article" for producing a three-dimensional object from a fluid medium according to the present invention comprises:

(a) a body of fluid medium capable of solidification when subjected to prescribed stimulation, i.e., a medium based on the epoxy-functional silicon-containing materials described in detail above;

(b) object support means immersed within the fluid medium for supporting a three-dimensional object to be formed;

(c) translational means for selectively moving the object support means progressively away from a designated surface of the fluid medium; and (d) reaction means capable of altering the physical state of the fluid medium, and operating in a prescribed pattern upon the designated surface of the medium, to provide a thin, solid lamina at the surface, representing a corresponding cross-sectional lamina of the three-dimensional object to be formed.

The system thus provides successive, adjacent laminae to form the three-dimensional object on the object support means, as the translational means moves the support means away from the designated surface.

Figure 1:
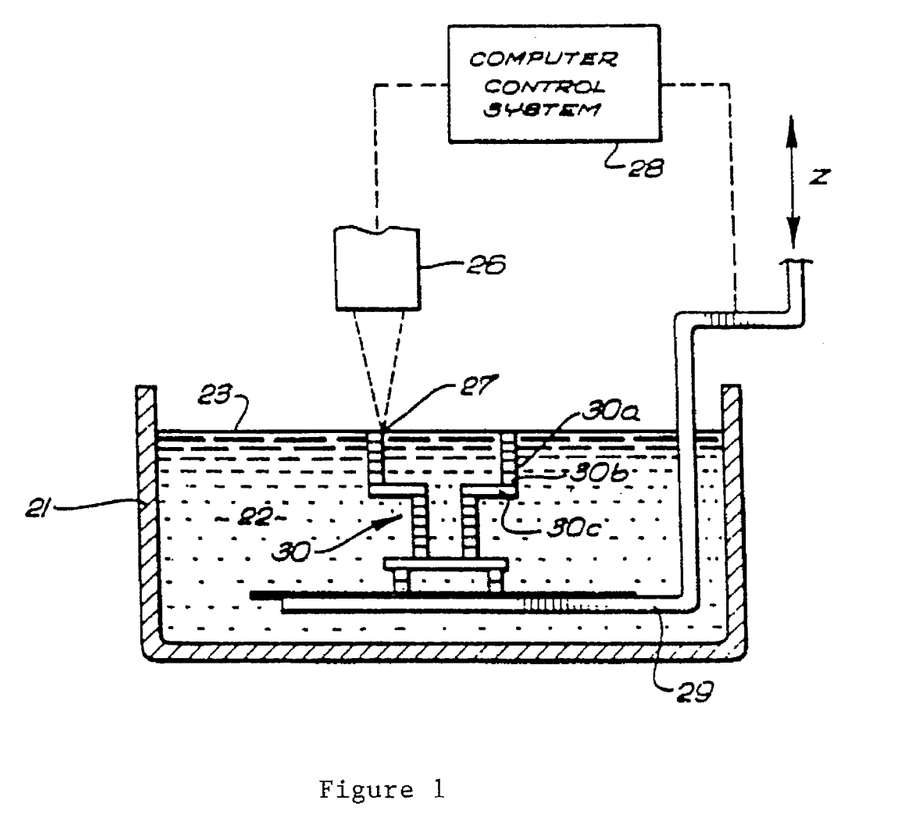
FIG. 1 is a depiction of an exemplary stereolithographic system.

One illustrative stereolithographic system suitable for this invention is depicted in FIG. 1. This figure is identical to FIG. 3 of the above-referenced Hull patent, U.S. Pat. No. 4,575,330. As shown in the figure, a container 21 is filled with the curable fluid medium 22 of this invention, to provide a designated working surface 23. The spot 27 is movable across the surface 23 by the motion of mirrors or other optical or mechanical elements (not shown) that are a part of light source 26. The position of the spot 27 on the surface 23 is controlled by a computer or other programming device 28. A moveable elevator platform 29 inside container 21 can be moved up and down selectively, the position of the platform being controlled by the computer 28. As the device operates, it produces a three-dimensional object 30 by step-wise buildup of integrated laminae such as 30a, 30b, and 30c.

Most of the details regarding stereolithographic systems and related processes are well-known in the art, and therefore do not warrant a detailed description herein. A helpful overview of stereolithography is provided by D. C. Neckers in *Chemtech*, October, 1990, pages 615–619, the contents of which are incorporated herein by reference.

Stereolithography is also described by C. W. Hull in U.S. Pat. Nos. 4,575,330 and 4,929,402, both of which are also incorporated herein by reference. In brief, the body of fluid medium which will be solidified, i.e., component (a), is first appropriately contained in a suitable vessel, so as to define a designated working surface of the medium, at which successive cross-sectional laminae can be generated. Reference to the various illustrations in U.S. Pat. No. 4,575,330 is generally instructive, e.g., FIGS. 2–4. Thus, in one illustrative embodiment, a container is adapted to hold the body of fluid medium which will be solidified, while an elevator platform functions as the means for supporting the three-dimensional object as it is formed. The elevator platform can be raised or lowered upon command to selectively move the object being formed away from the work surface of the fluid medium. As each cured or partially-cured "slice" or lamina is moved away from the fluid medium surface, the next lamina is formed in the new liquid which replaces the space previously taken up by the formed lamina. Thus, successive laminae are superimposed and integral with all of the other cross-sectional laminae. This process is repeated until the entire object has been formed.

As described above, formation of each lamina is effected by reaction means which alter the physical state of the fluid medium. The reaction means could be a variety of energy sources, but is usually a beam of light having a wavelength in the range of about 200 nm to about 700 nm. Ultraviolet (UV) radiation is often preferred for this invention, and exists in a wavelength of about 200 nm to about 400 nm. However, curing by the use of visible light (400–700 nm) is also possible.

When UV light is employed, the preferred light sources are helium-cadmium or argon-ion lasers which have their emission in the mid-region of the UV spectrum. Other lasers could also be suitable, e.g., dye lasers, face-pumped lasers, and diode lasers which emit at various wavelengths throughout the UV region of the electromagnetic spectrum.

Other possible energy sources are taught in U.S. Pat. No. 4,575,330, e.g., a beam of impinging radiation, an electron beam, a beam of high energy particles, or x-rays. Again, those of ordinary skill in the art will be able to select the most appropriate energy source and means of delivering that source.

Usually, the light source for the curing reaction produces a spot of light small enough to allow the desired object detail to be formed, and intense enough to cure the liquid medium quickly enough to be practical. The light source can be programmed to turn on and off, and to move, such that the focused spot moves across the surface of the liquid medium, "drawing" a solid pattern on the surface.

It should be apparent that programmed control means, e.g., a computer, is usually a very useful component for the present invention. First, it helps the actual operator of the system design the three-dimensional object in a way that it can be made. In other words, the graphic image output can be derived from a computer, and can then be used to define successive, adjacent cross-sections of the three-dimensional object being formed. Computer software for carrying out these functions is available in the art, while the computer aided design (CAD) and computer aided manufacturing (CAM) techniques which enhance the abilities of computers for these types of functions are also well-known. In a typical situation, the system operator is able to design the object and view it three-dimensionally on the screen of the computer. When the operator is finished with the design, he/she can instruct the computer to make the object. The computer will then issue the appropriate instructions to the stereolithographic components.

After the three-dimensional object has been formed, it is usually removed from the apparatus and then rinsed, e.g., an ultrasonic rinse in a solvent such as acetone, which would dissolve the uncured fluid medium but not the cured, solid state medium. Any other conventional method for cleaning the object and removing uncured material may also be utilized.

At this stage, the object usually has sufficient green strength for handling. Additional curing (i.e., "postcuring") can then be undertaken. Postcuring can be carried out thermally, by heating the solid object above its $T_g$ value in a standard convection oven. As an example, the temperature could be increased to about 150° C., with a holding time from about 10 minutes to about 2 hours, for an object having a wall thickness of about 1 centimeter. These parameters will obviously vary, depending on the nature of the particular monomers or oligomers originally utilized.

Alternatively, the curing process could be completed by exposing the object to intense UV light, e.g., a high wattage UV cure lamp, or low pressure fluorescent lights. (A combination of heat and light could also be used.) In general, postcuring greatly improves the mechanical properties of the object.

After being fully cured, the three-dimensional objects based on this invention are tough, transparent, colorless-to-pale yellow solids with high $T_g$'s.

Those skilled in the art realize that this invention is not limited to any particular stereolithographic process or apparatus.

EXAMPLES

The following examples are given by way of illustration and are not indicative of the limitations of this invention.

EXAMPLE 1

A mixture ("photopolymer composition A") of bis[2-(3{7-oxabicyclo[4.1.0]heptyl})ethyl]-1,1,3,3-tetramethyldisiloxane (monomer I) having the following structure:

and 0.5% by weight diphenyl(4-thiophenoxyphenyl) sulfonium hexafluoroantimonate ("photoinitiator X") was prepared and used for stereolithographic tests employing a 3D Systems, Inc. SLA 250 Stereolithography Apparatus. This equipment is equipped with a 20 mW helium-cadmium laser having an emission wavelength at 325 nm. Sensitivity measurements were made. Plotting the natural log of the exposure energy versus the depth of penetration of the laser beam gives a line with a slope ($D_p$) of 6.6 mils. $D_p$ represents the depth of cure, and should ideally be in the range of about 5 to 10 mils.

The intercept of the plotted line gives the critical energy, $E_{crit}$, of 4.88 mJ/cm². Commercially available acrylate-based photopolymers used in photolithographic applications usually have a $D_p$ of about 5–8 mils, and an $E_{crit}$ value of about 4–8 mJ/cm². These values are nearly optimal for most stereolithographic applications. At the same time, a cationic system (Allied-Signal Exactomer 2001), which was tested, had a $D_p$ in the range of 5–8 mils, and its $E_{crit}$ value was 30 mJ/cm².

The lower the $E_{crit}$ value, the more sensitive the resin, and the faster the writing (laser scanning) speed. This factor controls the overall rate (productivity) of the prototype building process. Based on the $E_{crit}$ value, photopolymer composition A is more photosensitive, and can be scanned 8–9 times more rapidly than Exactomer 2001.

Another critical factor in stereolithography is the amount of distortion which takes place during photopolymerization, due to shrinkage of the monomer. This is measured as the "% curl". "Curl" is a type of distortion than can occur in all 3-dimensional models which are built up by a succession of layers, where the solidifying material undergoes shrinkage. The curl factor, $C_f$, is defined by the following equation in which $\delta$ is the vertical distortion distance and L is the length of the cantilever from the closest support.

$$\%C_f=(\delta/L)\cdot 100$$

Curl is characterized by an upward bending of the edges and corners of the imaged object, away from the ideal planar shape. The lower the curl factor, the better the resin will conform to the dimensions desired for the model. Furthermore, because the curl factor is related to the strain built into the model, lower curl values result in less strain. Lower strain usually correlates to better mechanical performance in the finished object. A typical curl factor of 12% at 6 mm is obtained for most commercial stereolithographic resins. In contrast, the formulation of this example had a $C_f$ value of 1.7%, which makes it especially suitable for the fabrication of stereolithographic objects with a high degree of accuracy and excellent mechanical performance.

Another advantage of the present system is that the postcure can be achieved simply on standing at room temperature for some period of time. To test the "green strength" of a stereolithographic formulation, test bars are produced by photopolymerization, and the bending modulus is measured. The formulation of this invention had a bending modulus of 300 N/mm², indicating that it has sufficient green strength to be directly handled. In fact, the green strength of these materials may be sufficient for many commercial applications without a postcure. The creep (overall distortion) of the photopolymers was approximately ⅓ that of commercially available stereolithographic resins, while the creep rate was ⅕ that of the commercially available acrylate-based resin.

The viscosity of photopolymer mixture A was about 67 cps at 27° C. Furthermore, the material exhibited low surface tension. These factors provide for rapid, uniform leveling of the liquid photopolymers, and may obviate the need for the wiper mentioned above.

Table 1 lists relevant properties for CibaTool XB5149 resin, from the Ciba-Geigy Company, and Exactomer 2201 resin, available from Allied-Signal Inc. (both outside the scope of the present invention), compared with photopolymer composition A. All three materials were exposed using a 3D Systems, Inc. SLA 250 StereoLithography Apparatus equipped with a 20 mW helium-cadmium laser with an emission wavelength at 325 nm. The Exactomer 2001 and photopolymer mixture A were postcured in a forced air oven for 20 minutes at 80° C. Photopolymer composition A showed no observable $T_g$ up to 250° C. after this treatment.

TABLE 1

Comparative Properties of Stereolithographic Resins[1]

| Property | Exactomer 2001 Composition[2] | CibaTool XB5149 Composition[3] | Photopolymer Composition A |
|---|---|---|---|
| Photosensitivity | | | |
| $D_{p\,(mil)}$ | 7 | 5.8 | 5.5 |
| Ecrit (mJ/cm²) | 27 | 5.5 | 4.3 |
| Green Strength | | | |
| Flex. modulus (N/mm²) | 211 | 100 | 300 |
| Creep (distortion, L = 120 mm) | | 115 mil | 40 mil |
| Creep (rate L = 120 mm, 12 hr.) | | 115 mil | 20 mil |
| Curl | 3% | 8–10% | 1.7% |
| Viscosity (cps/°C.) | 205/30 | 1600–2400/30 | 67/27 |

[1] 3D Systems SLA 250 equipped with a helium-cadium laser.
[2] Allied-Signal Corp.
[3] Ciba-Geigy Corp., Rapid Prototyping Report, Nov. 1992, p. 4

It's clear from Table 1 and the preceding description that photopolymers used in this invention, e.g., Composition A, exhibit excellent photosensitivity and mechanical properties. Moreover, these compositions do not contain acrylates or N-vinylpyrrolidone (e.g. CibaTool XG5149), which have toxic and/or sensitizing properties. Exactomer 2201 is a vinyl ether based resin which also has similar non-toxic characteristics.

EXAMPLES 2–6

In another demonstration of the design and application of this invention, four formulations were prepared and tested for their sensitivity at 351 and 364 nm wavelengths, using an argon-ion laser. A 3D Systems, Inc. SLA 500 Stereolithography Apparatus was used for these experiments. The compositions of the four formulations (and that of photopolymer composition A) are shown in Table 2, along with the results of the $E_{crit}$ and $D_p$ measurements. Propylene carbonate is a commonly-used carrier for incorporating the photoinitiator into UV-curable compositions.

TABLE 2

Stereolithography Using an Ar Ion Laser

| Formulation | Photopolymer Composition A | Photopolymer Composition E | Photopolymer Composition K | Photopolymer Composition L | Photopolymer Composition R |
|---|---|---|---|---|---|
| Photoinitiator X | 0.5 g | 0.5 g | 1.0 g | 0.5 g | 0.75 g |
| monomer I | 100 g | 100 g | 100 g | 100 g | 75 g |
| anthracene | — | 0.2 g | 0.5 g | 0.5 g | 1.5 g* |
| propylene carbonate | 0.5 g | 0.5 g | 1.0 g | 0.5 g | 0.75 g |
| $D_p$ | >10 mil | 6.1 mil | 3.1 mil | 3.3 mil | 1.9 mil |
| Ecrit. | >40 mJ/cm$^2$ | 35.6 mJ/cm$^2$ | 31 mJ/cm$^2$ | 29 mJ/cm$^2$ | 35 mJ/cm$^2$ |

*2-ethyl-9,10-dimethoxyanthracene used in this case.

The data of Table 2 demonstrate that anthracene or 2-ethyl-9,10-dimethoxyanthracene can be used to photosensitize the formulation to the longer wavelengths emitted by the argon-ion laser. Whereas photopolymer composition A, containing no photosensitizer, displays little sensitivity to the argon ion laser, the addition of anthracene or 2-ethyl-9,10-dimethoxyanthracene produces a marked response to the 351 and 361 nm emission bands of the laser. Table 2 shows that as the photosensitizer concentration increases, a large drop in the $D_p$ occurs, with a corresponding decrease in the $E_{crit}$ value.

EXAMPLES 7–11

As described above, other compounds besides those based on anthracene may be employed as photosensitizers. In examples 5–8, the effects of the use of perylene and pyrene as photosensitizers were tested. The addition of perylene (for photopolymer composition M) and pyrene to photopolymer composition A greatly decreased both the $E_{crit}$ and $D_p$ values. The concentration of pyrene was systematically varied, and the effects on the $E_{crit}$ and $D_p$ values were studied (photopolymer compositions N-Q).

TABLE 3

Stereolithography Using an Ar Ion Laser

| Formulation | Photopolymer Composition M | Photopolymer Composition N | Photopolymer Composition O | Photopolymer Composition P | Photopolymer Composition Q |
|---|---|---|---|---|---|
| Photoinitiator X | 0.5 g | 0.5 g | 0.5 g | 0.5 g | 0.5 g |
| monomer I | 100 g | 100 g | 100 g | 100 g | 100 g |
| photosensitizer | 0.1 g perylene | 0.5 g pyrene | 0.75 g pyrene | 1.0 g pyrene | 1.25 g pyrene |
| propylene carbonate | 0.5 g | 0.5 g | 0.5 g | 0.5 g | 0.5 g |
| $D_P$ (mil) | 17 | 11(10)* | 4.5 | 3.4 | 3.2 |
| Ecrit. (mJ/cm$^2$) | 30 | 27(32)* | 62 | 41 | 48 |

*Two measurements were made on this photopolymer.

It may be observed that in the above cases in which pyrene is used as a photosensitizer, the $D_p$ decreases with an increasing concentration of pyrene while the $E_{crit}$ tends to increase. Thus, pyrene is a better photosensitizer at lower concentrations than at higher concentrations, and there is an optimal concentration of the photosensitizer in this instance, which appears to be below about 0.5 g.

Particular embodiments of this invention have been illustrated and described above. However, those of ordinary skill in the art understand that various modifications can be made, without departing from the spirit and scope of the invention. Accordingly, interpretation of this invention should not be limited, except as by the appended claims.

All of the patents and publications mentioned above are incorporated herein by reference.

I claim:

1. An improved system for producing a three-dimensional object from a fluid medium, comprising the following components:

(a) a body of fluid medium capable of solidification when subjected to prescribed stimulation, said fluid medium itself comprising:

(i) at least one monomer or oligomer containing at least one epoxycyclohexyl group which is bonded directly or indirectly to a group containing at least one silicon atom, and (ii) a cationic photoinitiator for component (i);

(b) object support means immersed within said fluid medium for supporting a three-dimensional object to be formed;

(c) translational means for selectively moving said object support means progressively away from a designated surface of said fluid medium; and (d) reaction means capable of altering the physical state of the fluid medium, and operating in a prescribed pattern upon said designated surface of the medium to provide a thin solid lamina at the surface, representing a corresponding cross-sectional lamina of the three-dimensional object to be formed;

whereby successive adjacent laminae are provided to form the three-dimensional object on the object support means as the translational means moves the support means away from the designated surface.

2. The system of claim 1, wherein component a(i) comprises a linear, branched or cyclic epoxy-functional silicone monomer or oligomer.

3. The system of claim 2, wherein the linear epoxy-functional silicone monomer or oligomer comprises multifunctional siloxane units having a formula selected from the group consisting of:

and, wherein each R group is, independently, a monovalent substituted or unsubstituted $C_{1-12}$ alkyl, $C_{1-12}$ cycloalkyl, or phenyl radical; each $R^1$ group is, independently, R, a monovalent $C_{2-12}$ alkyl radical, or a monovalent epoxy-functional group having about 2 to 10 carbon atoms, with the proviso that at least one of the $R^1$ groups is epoxy- functional; $R^2$ is an alkylene or alkylene ether group containing about 2 to about 20 carbon atoms;

n is about 1 to about 10; and m is 1 to 4.

4. The system of claim 3, wherein the epoxy-functional silicone monomer is bis[2-(3{7-oxabicyclo[4.1.0]heptyl}) ethyl]-1,1,3,3-tetramethyldisiloxane, or bis[2-{2,3-epoxybicyclo[2.2.1]heptyl})ethyl]-1,1,3,3-tetramethyldisiloxane.

5. The system of claim 2, wherein component a(i) comprises an oligomeric polysiloxane containing pendant epoxycyclohexyl groups.

6. The system of claim 1, wherein component a(i) comprises a silicon-containing epoxy monomer having the formula wherein each R group is, independently, a monovalent substituted or unsubstituted $C_{1-12}$ alkyl, $C_{1-12}$ cycloalkyl, or phenyl radical; each $R^1$ group is, independently, R, a monovalent $C_{2-12}$ alkyl radical, or a monovalent epoxy-functional group having about 2 to 10 carbon atoms, with the proviso that at least one of the $R^1$ groups is epoxy-functional; and m is 1 to 4.

7. The system of claim 6, wherein the silicon monomer is methylphenyl-di(epoxy cyclohexylethyl)silane.

8. The system of claim 1, wherein component a(i) is a cyclic epoxy-functional silicone monomer or oligomer comprising siloxane units of the formula wherein each R group is independently selected from the group consisting of monovalent $C_{1-12}$ alkyls, $C_{1-12}$ cycloalkyls, and phenyl radicals; each $R^1$ group is independently selected from the group consisting of R, monovalent $C_{2-12}$ radicals, and a monovalent epoxy-functional group having about 2 to 10 carbon atoms, with the proviso that at least one of the $R^1$ groups is epoxy-functional; and n is from 3 to about 10.

9. The system of claim 8, wherein R is methyl, $R^1$ is a methyl or cycloaliphatic epoxy-functional group having about 2 to 10 carbon atoms, and n is 4.

10. The system of claim 8, wherein R is a monovalent halogen-substituted $C_{1-12}$ alkyl radical or a $C_{1-12}$ cycloalkyl radical.

11. The system of claim 1, wherein the cationic photoinitiator of component a(ii) comprises an onium salt photocatalyst selected from the group consisting of diaryliodonium salts, triarylsulfonium salts, aryldiazonium salts, ferrocenium salts, diarylsulfoxonium salts, diaryliodoxonium salts, triarylsulfoxonium salts, dialkylphenacylsulfonium salts, dialkylhydroxyphenylsulfonium salts, phenacyltriarylphosphonium salts, and phenacyl salts of heterocyclic nitrogen-containing compounds.

12. The system of claim 1, wherein component (a) further includes an acrylate or methacrylate monomer and an appropriate free radical photoinitiator for the acrylate or methacrylate monomer.

13. The system of claim 12, wherein the amount of the acrylate or methacrylate monomer and free radical photoinitiator present is in the range of about 0.1% by weight to about 35% by weight, based on the total weight of component (a).

14. The system of claim 12, wherein the acrylate or methacrylate monomer is selected from the group consisting of hexanediol diacrylate, trimethylolpropane triacrylate, pentaerythritol triacrylate, neopentylglycol dimethacrylate, the diacrylic acid adduct to bisphenol A, and the diacrylic acid adduct to bisphenol A diglycidyl ether.

15. The system of claim 12, wherein the free radical photoinitiator is selected from the group consisting of benzoin butyl ether; 2,2-diethoxyacetophenone; 2-chloroacetophenone; 1-benzoylcyclohexanol; and benzoyldiphenyl phosphine oxide.

16. The system of claim 1, wherein component (a) further includes a cationically-polymerizable vinyl or 1-propenyl ether monomer.

17. The system of claim 16, wherein the amount of the cationically-polymerizable vinyl or 1-propenyl ether monomer present is in the range of about 0.1% by weight to about 35% by weight, based on the total weight of component (a).

18. The system of claim 1, wherein component (a) further includes at least one additional epoxy resin.

19. The system of claim 18, wherein the epoxy resin is selected from the group consisting of 3,4-epoxycyclohexylmethyl 3',4'-epoxycyclohexane carboxylate; bisphenol-A diglycidyl ether; epoxidized polybutadiene; 1,4-cyclohexanedimethanol diglycidyl ether; epoxidized linseed oil; epoxidized soybean oil; an epoxidized methyl ester of linoleic acid; limonene dioxide; dicyclopentadiene dioxide; epoxy cresol novolac resins; epoxy phenol novolac resins; 1,7-diepoxyoctane; vinyl cyclohexene monoxide; 1,4-butanediol diglycidyl ether; and diglycidylphthalate.

20. The system of claim 1, wherein component (a) further includes at least one polyol resin.

21. The system of claim 20, wherein the polyol resin is selected from the group consisting of polyether polyols, polyester polyols, polycaprolactone polyols, and hydroxyl-terminated polyolefins.

22. The system of claim 1, wherein component (a) further includes a copper co-catalyst.

23. The system of claim 1, wherein component (a) further includes at least one photosensitizer.

24. The system of claim 23, wherein the photosensitizer is selected from the group consisting of anthracene, naphthalene, perylene, pyrene, phenothiazine; 9,10-phenanthrenequinone; bianthrone; anthrone; 9-butoxyanthracene; 1-ethyl-9,10-dimethoxyanthracene; acridine orange; benzoflavin; phosphine R; 1-ethyl-9-ethoxyanthracene; 1-ethyl-9,10-dimethoxyanthracene; 2-isopropylthioxanthone; and 2-chlorothioxanthone.

25. The system of claim 24, wherein the amount of photosensitizer present is in the range of about 0.05% by weight to about 10% by weight, based on the total weight of component (a).

26. The system of claim 1, wherein component (a) further includes effective amounts of at least one additive selected from the group consisting of adhesion agents, wetting agents, flatting agents, flow control agents, stabilizers, pigments, dyes, and fillers.

27. The system of claim 1, further including programmed control means for varying the graphic pattern of said reaction means operating upon the designated surface of the fluid medium.

28. The system of claim 1, wherein the reaction means of component (d) includes a beam of light having a wavelength in the range of about 200 nm to about 700 nm.

29. The system of claim 1, wherein the reaction means of component (d) includes a beam of ultraviolet light.

30. A stereolithographic system for producing a three-dimensional object from a fluid medium capable of solidification when subjected to prescribed stimulation, wherein the medium comprises the following components:
   (i) at least one monomer or oligomer containing at least one epoxycyclohexyl group which is bonded directly or indirectly to a group containing at least one silicon atom, and
   (ii) a cationic photoinitiator for component (i).

31. A method for producing a three-dimensional object from a medium capable of solidification when subjected to prescribed radiation, comprising the following steps:
   (I) containing a body of the medium, which itself comprises the following components:
      (i) at least one monomer or oligomer containing at least one epoxycyclohexyl group which is bonded directly or indirectly to a group containing at least one silicon atom, and
      (ii) a cationic photoinitiator for component (i);
   (II) drawing upon and forming successive cross-sectional laminae of the object at a two-dimensional interface of the medium defining a designated working surface, said laminae including a first cross-sectional layer of structure at the working surface;
   (III) automatically coating over the entire first cross-sectional layer of structure with a body of the medium, in preparation for formation of a second cross-sectional layer of structure adhered to the first cross-sectional layer; and
   (IV) moving said cross-sectional layers as they are formed, and building up the object from a plurality of successively adhered layers of structure in stepwise fashion, whereby a three-dimensional object is extracted from a substantially two-dimensional surface.

32. The method of claim 31, wherein the three-dimensional object prepared in step (IV) is post-cured after it has been subjected to the prescribed radiation.

33. A method for directly producing a three-dimensional object as it is designed by a computer, comprising the following steps:
   (I) deriving graphic image output from the computer, said graphic image output defining successive adjacent cross-sections of the three-dimensional object designed by the computer;
   (II) containing a medium capable of solidification; said medium itself comprising the following components:
      (i) at least one monomer or oligomer containing at least one epoxycyclohexyl group which is bonded directly or indirectly to a group containing at least one silicon atom, and
      (ii) a cationic photoinitiator for component (i);
   (III) drawing upon and forming successive layer cross-sections, corresponding to the computer-designed cross-sections of the object, at a two-dimensional interface of the medium defining a working surface, said layer cross-sections including a first cross-sectional layer of structure at said working surface;
   (IV) automatically coating over the entire first cross-sectional layer of structure with a body of the medium, in preparation for formation of a second cross-sectional layer of structure adhered to the first cross-sectional layer;
   (V) moving the cross-sectional layers as they are formed, and building up the object from a plurality of successively-adhered layers in a stepwise fashion, whereby the three-dimensional object designed by the computer is automatically extracted from a substantially two-dimensional surface.

34. In a stereolithographic method for producing a three-dimensional object from a fluid medium capable of solidification when subjected to prescribed stimulation, the improvement comprising the following steps:
   utilizing as the fluid medium a composition which itself comprises the following components:
      (i) at least one monomer or oligomer containing at least one epoxycyclohexyl group which is bonded directly or indirectly to a group containing at least one silicon atom, and
      (ii) a cationic photoinitiator for component (i).

* * * * *